United States Patent
Hsiao et al.

(10) Patent No.: US 10,691,534 B2
(45) Date of Patent: Jun. 23, 2020

(54) DATA ENCODING METHOD, DATA DECODING METHOD AND STORAGE CONTROLLER

(71) Applicant: SHENZHEN EPOSTAR ELECTRONICS LIMITED CO., Shenzhen OT (CN)

(72) Inventors: Yu-Hua Hsiao, Hsinchu County (TW); Hsiu-Hsien Chu, Hsinchu (TW); Heng-Lin Yen, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 73 days.

(21) Appl. No.: 15/950,184

(22) Filed: Apr. 11, 2018

(65) Prior Publication Data

US 2019/0138391 A1    May 9, 2019

(30) Foreign Application Priority Data

Nov. 3, 2017  (TW) .............................. 106138037 A

(51) Int. Cl.
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01);
(Continued)

(58) Field of Classification Search
CPC ............. G06F 11/1068; G06F 11/1012; G06F 11/1004; G06F 3/0619; G06F 3/064; G06F 3/0659; G06F 3/0679; G11C 29/52
(Continued)

(56) References Cited

U.S. PATENT DOCUMENTS 9,354,872 B2 * 5/2016 Amidi .................. G06F 3/0619
2001/0037443 A1 * 11/2001 Liu ....................... G06F 9/3867
712/200
(Continued)

FOREIGN PATENT DOCUMENTS

WO    2012042008    4/2012

OTHER PUBLICATIONS

Office Action of Taiwan Counterpart Application, dated Jul. 11, 2018, pp. 1-17.
(Continued)

*Primary Examiner* — James C Kerveros
(74) *Attorney, Agent, or Firm* — JCIPRNET

(57) ABSTRACT

A data encoding method, a data decoding method, and a storage controller are provided. The encoding method includes: obtaining a verification data corresponding to a raw data according to a write command; adding the verification data to the raw data, and obtaining a scrambled data accordingly; and performing an encoding operation on the scrambled data to obtain a codeword data. The decoding method includes: performing a decoding operation on a codeword data to obtain a decoded codeword data, and obtaining a pre-scrambling data accordingly; identifying a verification data and a raw data in the pre-scrambling data; identifying one or more first system data corresponding to the raw data according to a read command; and determining whether the raw data is correct by comparing the one or more first system data and the verification data.

8 Claims, 7 Drawing Sheets

(52) U.S. Cl.
CPC .......... *G06F 3/0659* (2013.01); *G06F 3/0679* (2013.01); *G06F 11/1004* (2013.01); *G06F 11/1012* (2013.01); *G11C 29/52* (2013.01)

(58) Field of Classification Search
USPC ........................................................ 714/764
See application file for complete search history.

(56) References Cited

U.S. PATENT DOCUMENTS

| | | | |
|---|---|---|---|
| 2005/0039185 A1* | 2/2005 | Heidari-Bateni | G06F 9/3851 718/104 |
| 2009/0135256 A1* | 5/2009 | Komori | H04N 5/2257 348/207.1 |
| 2011/0222587 A1* | 9/2011 | Chen | H04B 1/713 375/132 |
| 2013/0182553 A1* | 7/2013 | Sugibuchi | H04L 1/0061 370/216 |

OTHER PUBLICATIONS

"Office Action of Taiwan Counterpart Application", dated May 3, 2018, p. 1-p. 15.

\* cited by examiner

DATA ENCODING METHOD, DATA DECODING METHOD AND STORAGE CONTROLLER

CROSS-REFERENCE TO RELATED APPLICATION

This application claims the priority benefit of Taiwan application serial no. 106138037, filed on Nov. 3, 2017. The entirety of the above-mentioned patent application is hereby incorporated by reference herein and made a part of this specification.

BACKGROUND OF THE INVENTION

Field of the Invention

The disclosure relates to a data encoding method and a data decoding method, and in particular, to a data encoding method, a data decoding method, and a storage controller suitable for a storage device provided with a rewritable non-volatile memory module.

Description of Related Art

As digital cameras, mobile phones, and MP3 players have been growing rapidly in recent years, consumers' demand for storage media has also been growing significantly. With characteristics including data non-volatility, energy saving, small size, lack of mechanical structures, etc., rewritable non-volatile memory modules (e.g., flash memories) are ideal to be built in various portable multi-media devices such as those listed above.

Generally, to ensure correctness of the data stored in the rewritable non-volatile memory module, data is encoded before the data is stored to the rewritable non-volatile memory module. The encoded data (including raw data and an error correcting code) is stored to the rewritable non-volatile memory module. Later, the encoded data may be read from the rewritable non-volatile memory module and then decoded to correct potential errors therein. Conventionally, the error correcting code is generally based on an algebraic decoding algorithm such as a BCH code, and now probabilistic decoding algorithms such as the low density parity check code (hereinafter also referred to as the LDPC code) have gradually become mature. An LDPC encoder/decoder uses a sparse matrix for encoding and iterative decoding. However, in some specific cases of data errors, the data that is reported to be successfully decoded and is sent back from the LDPC encoder/decoder is still erroneous. The phenomenon where the reportedly successfully decoded data is still erroneous is called the near codeword phenomenon, and such data is called a near codeword. The near codeword phenomenon is also found in an encoder/decoder using other algorithms.

To solve the issue of near codewords, conventionally, before the raw data is encoded, a cyclic redundancy check (CRC) operation is performed on raw data to obtain a corresponding cyclic redundancy check code, the cyclic redundancy check code is added to the raw data, and then the encoder/decoder performs an encoding operation. Afterwards, it is possible to check whether the data reported by the encoder/decoder to be successfully decoded is correct according to the cyclic redundancy check code.

However, both executing the cyclic redundancy check operation and the cyclic redundancy check code itself additionally consume computational resources or space of the system. Therefore, how to verify whether the decoded data is correct in an improved manner to solve the issue of near codewords while enhancing correctness of the encoding/decoding operation and further enhancing stability and efficiency of the storage device is one of the issues that people skilled in the art seek to study.

SUMMARY OF THE INVENTION

The embodiments of the invention provide a data encoding method, a data decoding method, and a storage controller that perform an encoding operation on data according to a known verification data corresponding to the data to be encoded. Moreover, it may verify whether a decoded data is correct according to a known verification data corresponding to the target data to be decoded.

An embodiment of the invention provides a data encoding method for encoding a raw data to be stored to a rewritable non-volatile memory module, wherein the rewritable non-volatile memory module includes a plurality of physical units, and each of the physical units includes a plurality of physical sub-units, wherein a plurality of physical addresses are assigned to the physical sub-units. The method includes: starting to execute a write command, wherein the write command instructs writing the raw data to one or more target physical addresses among the physical addresses; obtaining a verification data corresponding to the raw data according to the write command; adding the verification data to the raw data to form a pre-scrambling data; performing a scramble operation on the pre-scrambling data to obtain a scrambled data; performing an encoding operation on the scrambled data to obtain a codeword data; and writing the codeword data to the one or more target physical addresses after obtaining the codeword data, so as to complete execution of the write command.

An embodiment of the invention provides a data decoding method for decoding a codeword data stored in a rewritable non-volatile memory module, wherein the rewritable non-volatile memory module includes a plurality of physical units, and each of the physical units includes a plurality of physical sub-units, wherein a plurality of physical addresses are assigned to the physical sub-units. The method includes: starting to execute a read command, and reading the codeword data from one or more target physical addresses among the physical addresses according to the read command; performing a decoding operation on the codeword data to obtain a decoded codeword data; performing a descramble operation on the decoded codeword data to obtain a pre-scrambling data; identifying a verification data and a raw data in the pre-scrambling data; identifying one or more first system data corresponding to the raw data according to the read command; determining whether the raw data is correct by comparing the one or more first system data and the verification data, wherein it is determined that the raw data is correct if the verification data is equal to the one or more first system data; and determining that the codeword data is successfully decoded when it is determined that the raw data is correct, and transmitting the raw data, so as to complete execution of the read command.

An embodiment of the invention provides a storage controller configured to control a storage device provided with a rewritable non-volatile memory module, wherein the rewritable non-volatile memory module includes a plurality of physical units, and each of the physical units includes a plurality of physical sub-units, wherein a plurality of physical addresses are assigned to the physical sub-units. The storage controller includes a memory interface control circuit, an error checking and correcting circuit, and a processor. The memory interface control circuit is configured to couple to the rewritable non-volatile memory module. The error checking and correcting circuit is configured to encode a raw data to be stored to the rewritable non-volatile memory module. The processor is coupled to the memory interface control circuit and the error checking and correcting circuit. The processor is configured to start to execute a write command to transmit the raw data to the error checking and correcting circuit, wherein the write command instructs writing the raw data to one or more target physical addresses among the physical addresses. The error checking and correcting circuit is configured to obtain a verification data corresponding to the raw data according to the write command. The error checking and correcting circuit is further configured to add the verification data to the raw data to form a pre-scrambling data. The error checking and correcting circuit is further configured to perform a scramble operation on the pre-scrambling data to obtain a scrambled data. Moreover, the error checking and correcting circuit is further configured to perform an encoding operation on the scrambled data to obtain a codeword data and respond to the processor that encoding of the codeword data corresponding to the raw data is completed. The processor is further configured to write the codeword data to the one or more target physical addresses, so as to complete execution of the write command.

An embodiment of the invention provides a storage controller configured to control a storage device provided with a rewritable non-volatile memory module, wherein the rewritable non-volatile memory module includes a plurality of physical units, and each of the physical units includes a plurality of physical sub-units, wherein a plurality of physical addresses are assigned to the physical sub-units. The storage controller includes a memory interface control circuit, an error checking and correcting circuit, and a processor. The memory interface control circuit is configured to couple to the rewritable non-volatile memory module. The error checking and correcting circuit is configured to decode a codeword data stored in the rewritable non-volatile memory module. The processor is coupled to the memory interface control circuit and the error checking and correcting circuit. The processor is configured to start to execute a read command, read the codeword data from one or more target physical addresses among the physical addresses according to the read command, and transmit the codeword data to the error checking and correcting circuit. The error checking and correcting circuit is configured to perform a decoding operation on the codeword data to obtain a decoded codeword data. The error checking and correcting circuit is further configured to perform a descramble operation on the decoded codeword data to obtain a pre-scrambling data. Moreover, the error checking and correcting circuit is further configured to identify a verification data and a raw data in the pre-scrambling data. The error checking and correcting circuit is further configured to identify one or more first system data corresponding to the raw data according to the read command. The error checking and correcting circuit is further configured to determine whether the raw data is correct by comparing the one or more first system data and the verification data, wherein the error checking and correcting circuit determines that the raw data is correct if the verification data is equal to the one or more first system data. When it is determined that the raw data is correct, the error checking and correcting circuit determines that the codeword data is successfully decoded, transmits the raw data, and responds to the processor that the raw data corresponding to the codeword data is successfully decoded, so as to complete execution of the read command.

Accordingly, in the data encoding method, the data decoding method, and the storage controller provided in the embodiments of the invention, in the encoding operation, the verification data is obtained according to the write command corresponding to the raw data to add the verification data to the raw data and then perform the encoding operation, and it is not necessary to add a cyclic redundancy check code to the raw data, which reduces the space consumed by the overall codeword data. Moreover, in the decoding operation, the one or more first system data are identified according to the read command corresponding to the codeword data, and it is determined whether the raw data obtained after decoding is correct according to the one or more first system data and the verification data. In particular, the encoding/decoding operations save the resources/capacity consumed by a cyclic redundancy check operation. Accordingly, it is still possible to check whether the decoded data is correct without the cyclic redundancy check code, which further solves the issue of near codewords and enhances overall efficiency in encoding/decoding data by the storage device while saving resources.

To provide a further understanding of the aforementioned and other features and advantages of the disclosure, exemplary embodiments, together with the reference drawings, are described in detail below.

DESCRIPTION OF THE EMBODIMENTS

In the present embodiment, a storage device includes a rewritable non-volatile memory module and a storage device controller (also referred to as a storage controller or a storage control circuit). Moreover, the storage device is used together with a host system, such that the host system can write data to the storage device or read data from the storage device.

Figure 1:
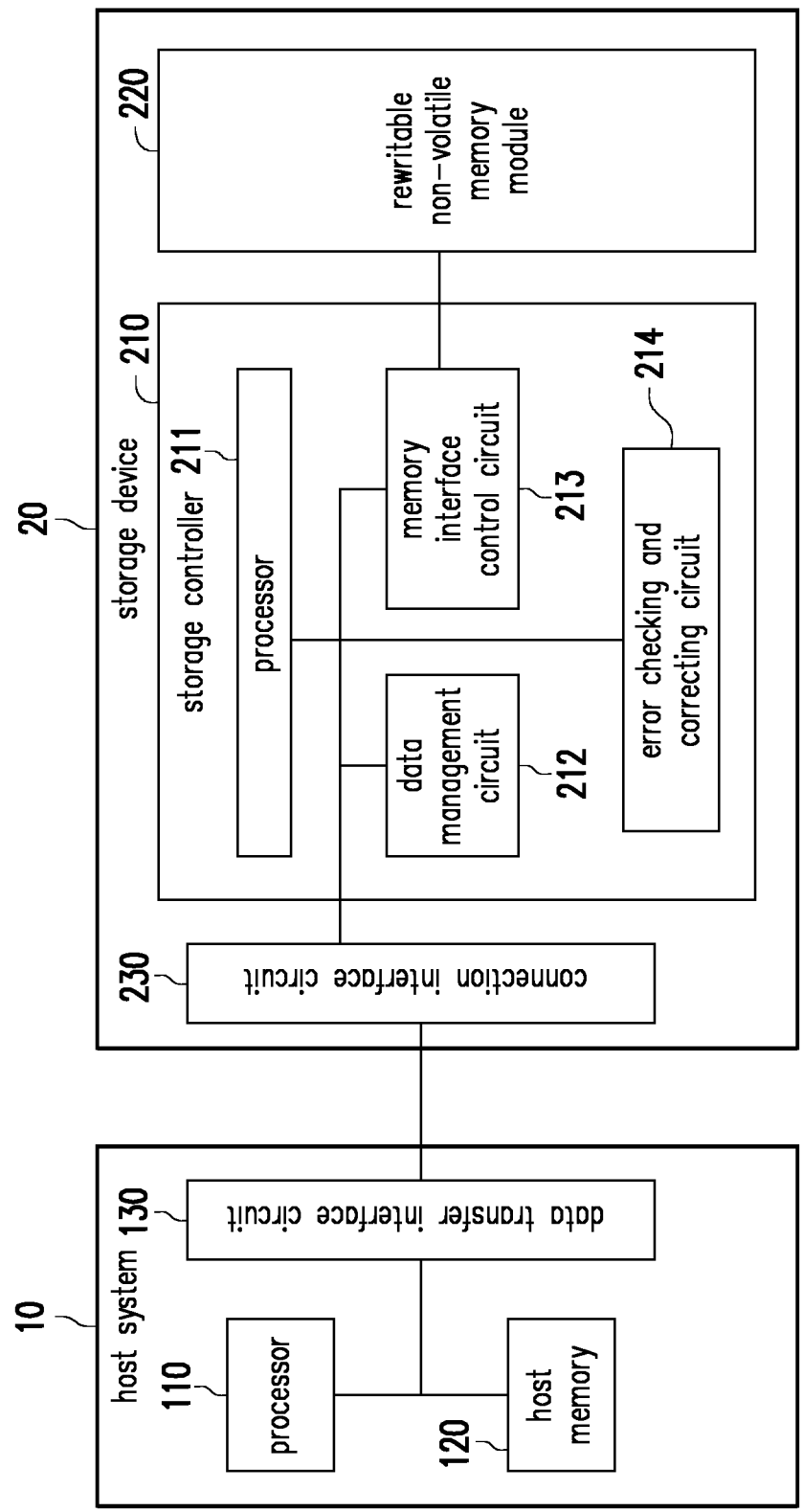
FIG. 1 is a block schematic diagram illustrating a host system and a storage device according to an embodiment of the invention.

FIG. 1 is a block schematic diagram illustrating a host system and a storage device according to an embodiment of the invention.

Referring to FIG. 1, a host system 10 includes a processor 110, a host memory 120, and a data transfer interface circuit 130. In the present embodiment, the data transfer interface circuit 130 is coupled (i.e., electrically connected) to the processor 110 and the host memory 120. In another embodiment, the processor 110, the host memory 120, and the data transfer interface circuit 130 are coupled to each other by using a system bus.

The storage device 20 includes a storage controller 210, a rewritable non-volatile memory module 220, and a connection interface circuit 230. Specifically, the storage controller 210 includes a processor 211, a data management circuit 212, and a memory interface control circuit 213.

In the present embodiment, the host system 10 is coupled to the storage device 20 via the data transfer interface circuit 130 and the connection interface circuit 230 of the storage device 20 to perform operations of data accessing. For example, the host system 10 may store data to the storage device 20 or read data from the storage device 20 via the data transfer interface circuit 130.

In the present embodiment, the processor 110, the host memory 120, and the data transfer interface circuit 130 may be installed on a motherboard of the host system 10. The number of the data transfer interface circuit 130 may be one or more. The motherboard may be coupled to the storage device 20 via the data transfer interface circuit 130 in wired or wireless manners. The storage device 20 is, for example, a flash drive, a memory card, a solid state drive (SSD), or a wireless memory storage device. The wireless memory storage device is, for example, a memory storage device based on various wireless communication technologies, such as a near field communication (NFC) memory storage device, a WiFi memory storage device, a Bluetooth memory storage device, or a low power Bluetooth memory storage device (e.g., iBeacon). Moreover, the motherboard may also be coupled via the system bus to various I/O devices, such as a global positioning system (GPS) module, a network interface card, a wireless transmission device, a keyboard, a screen, and a speaker.

In the present embodiment, the data transfer interface circuit 130 and the connection interface circuit 230 are interface circuits that are compatible with the Peripheral Component Interconnect Express (PCI Express) standard. Moreover, data transfer is performed between the data transfer interface circuit 130 and the connection interface circuit 230 through the Non-Volatile Memory express (NVMe) communication protocol.

However, it is understood that the invention is not limited hereto. The data transfer interface circuit 130 and the connection interface circuit 230 may also be compatible with the Parallel Advanced Technology Attachment (PATA) standard, the Institute of Electrical and Electronic Engineers (IEEE) 1394 standard, the Serial Advanced Technology Attachment (SATA) standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the Multi-Chip Package interface standard, the Multi Media Card (MMC) interface standard, the eMMC interface standard, the Universal Flash Storage (UFS) interface standard, the eMCP interface standard, the CF interface standard, the Integrated Device Electronics (IDE) standard, or other suitable standards. Moreover, in another embodiment, the connection interface circuit 230 may be packaged with the storage controller 210 in one single chip, or the connection interface circuit 230 may be disposed outside a chip including the storage controller 210.

In the present embodiment, the host memory 120 is configured to temporarily store commands or data executed by the processor 110. For example, in the present exemplary embodiment, the host memory 120 may be a dynamic random access memory (DRAM), a static random access memory (SRAM), etc. However, it is understood that the invention is not limited hereto, and the host memory 120 may also be another suitable memory.

The storage controller 210 is configured to execute a plurality of logic gates or control commands implemented in a hardware form or a firmware form and perform operations such as data writing, reading, erasing, etc. in the rewritable non-volatile memory module 220 according to commands of the host system 10.

In detail, the processor 211 in the storage controller 210 is hardware that has computational capacity and is configured to control overall operation of the storage controller 210. Specifically, the processor 211 has a plurality of control commands, and the control commands are executed to perform operations of data writing, reading, erasing, etc. when the storage device 20 is operated.

In the present embodiment, the processor 110 and the processor 211 are, for example, central processing units (CPU), micro-processors, or other programmable processors, digital signal processors (DSP), programmable controllers, application specific integrated circuits (ASIC), programmable logic devices (PLD), or other similar devices, and the invention is not limited hereto.

In an embodiment, the storage controller 210 further includes a read only memory (not illustrated) and a random access memory (not illustrated). More particularly, the read only memory has a boot code, which is executed by the processor 211 to load control commands stored in the rewritable non-volatile memory module 220 to the random access memory of the storage controller 210 when the storage controller 210 is enabled. Afterwards, the control commands are run by the processor 211 to perform operations of data writing, reading, erasing, etc. In another embodiment, the control commands of the processor 211 may also be stored as program codes in a specific area of the rewritable non-volatile memory module 220 (for example, in physical storage units in the rewritable non-volatile memory module 220 exclusively used for storing system data).

In the present embodiment, as mentioned above, the storage controller 210 further includes the data management circuit 212, the memory interface control circuit 213, and an error checking and correcting circuit 214. It is noted that operations executed by the components of the storage controller 220 are also regarded as operations executed by the storage controller 220.

The data management circuit 212 is coupled to the processor 211, the memory interface control circuit 213, and the connection interface circuit 230. The data management circuit 212 is configured to receive commands of the processor 211 to perform data transfer. For example, data is read from the host system 10 (e.g., the host memory 120) via the connection interface circuit 230, and the read data is written to the rewritable non-volatile memory module 220 via the memory interface control circuit 213 (e.g., performing a write operation according to a write command from the host system 10). In another example, data is read from one or more physical units of the rewritable non-volatile memory module 220 via the memory interface control circuit 213 (namely, data may be read from one or more memory cells/physical sub-units in the one or more physical units), and the read data is written to the host system 10 (e.g., the host memory 120) via the connection interface circuit 230 (e.g., performing a read operation according to a read command from the host system 10). In another embodiment, the data management circuit 212 may also be integrated into the processor 211.

The memory interface control circuit 213 is configured to receive commands of the processor 211 and work with the data management circuit 212 to perform write (also referred to as programming) operations, read operations, or erase operations on the rewritable non-volatile memory module 220.

For example, the processor 211 may execute a write command sequence (or the processor 211 instructs the data management circuit 212 to send the write command sequence to the memory interface control circuit 213) to instruct the memory interface control circuit 213 to write data to one or more physical addresses (also referred to as target physical addresses) in the rewritable non-volatile memory module 220. The processor 211 may execute a read command sequence (or the processor 211 instructs the data management circuit 212 to send the read command sequence to the memory interface control circuit 213) to instruct the memory interface control circuit 213 to read data from one or more physical addresses (also referred to as target physical addresses) corresponding to the read command in the rewritable non-volatile memory module 220. The processor 211 may execute an erase command sequence (or the processor 211 instructs the data management circuit 212 to send the erase command sequence to the memory interface control circuit 213) to instruct the memory interface control circuit 213 to perform an erase operation on the rewritable non-volatile memory module 220. The write command sequence, the read command sequence, and the erase command sequence may respectively include one or more program codes or command codes and are configured to instruct performing the corresponding operations, such as data writing, reading, and erasing, on the rewritable non-volatile memory module 220. In an embodiment, the processor 211 may further issue command sequences of other types for the memory interface control circuit 213 to perform corresponding operations on the rewritable non-volatile memory module 220.

Moreover, data to be written to the rewritable non-volatile memory module 220 is converted into a format acceptable by the rewritable non-volatile memory module 220 through the memory interface control circuit 213. Specifically, if the processor 211 is to access the rewritable non-volatile memory module 220, the processor 211 transmits corresponding command sequences to the memory interface control circuit 213 to instruct the memory interface control circuit 213 to perform corresponding operations. For example, the command sequences may include the write command sequence for instructing writing data, the read command sequence for instructing reading data, the erase command sequence for instructing erasing data, and other corresponding command sequences for instructing performing various memory operations (e.g., a garbage collection operation and a wear leveling operation). The command sequences may include one or more signals, or data on the bus. The signals or the data may include command codes or program codes. For example, in a read command sequence, information such as read identification codes and memory addresses is included.

Figure 2:
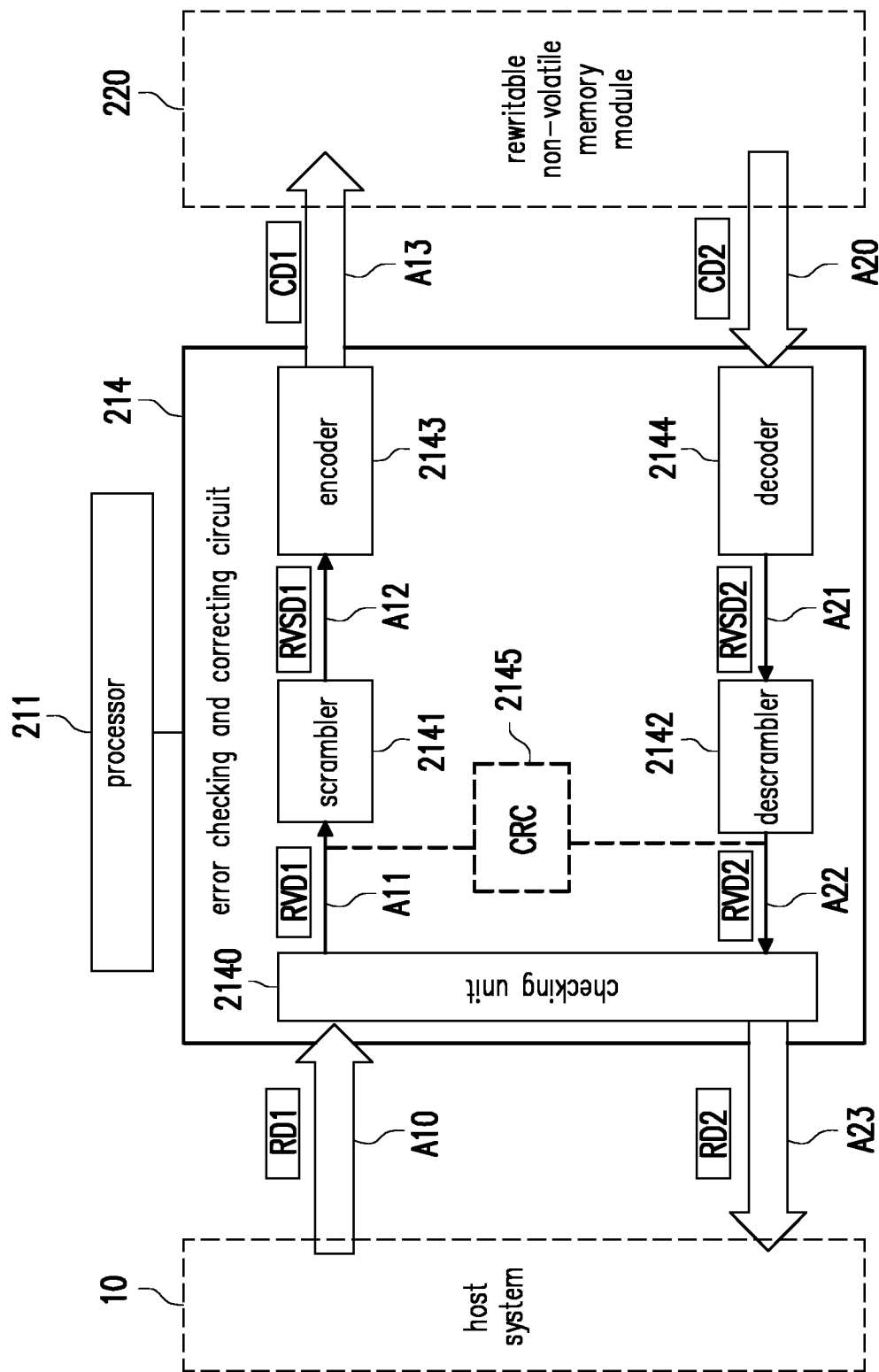
FIG. 2 is a schematic diagram illustrating an encoding/decoding operation performed by an error checking circuit according to an embodiment of the invention.

FIG. 2 is a schematic diagram illustrating an encoding/decoding operation performed by an error checking circuit according to an embodiment of the invention. Referring to FIG. 2, in the present embodiment, the error checking and correcting circuit 214 includes a checking unit 2140, a scrambler 2141, a descrambler 2142, an encoder 2143, and a decoder 2144. In another embodiment, the error checking and correcting circuit 214 further includes a cyclic redundancy checker (CRC) 2145.

In the present embodiment, the checking unit 2140, the encoder 2143, and the decoder 2144 are implemented as hardware circuits. It is noted that, in an embodiment, the scrambler 2141 and the descrambler 2142 may be integrated as one single scrambler/descrambler, and the encoder 2143 and the decoder 2144 may be integrated as one single encoder/decoder. Moreover, in another embodiment, the scrambler 2141 may also be integrated into the encoder 2143, and the descrambler 2142 may also be integrated into the decoder 2144.

The error checking and correcting circuit 214 is configured to perform an error checking and correcting procedure to ensure correctness of data (also referred to as codeword/codeword data) stored in the rewritable non-volatile memory module 220. The error checking and correcting procedure is, for example, divided into (1) an encoding procedure (encoding operation) for editing raw data into codeword data, and (2) a decoding procedure (decoding operation) for decoding codeword data into raw data.

In the encoding procedure, the checking unit 2140 is configured to add verification data corresponding to the raw data to the raw data. The scrambler 2141 is configured to perform a scramble operation on the received data to output scrambled data. The encoder 2143 is configured to perform an encoding operation on the received data (e.g., the scrambled data) to add an error checking and correcting code to the received data to form codeword data.

In the decoding procedure, the decoder 2144 is configured to perform a decoding operation on the received data (e.g., the codeword data) to decode/correct the received codeword data according to the error checking and correcting code therein and to further output data (e.g., the scrambled data) to the descrambler 2142. The descrambler 2142 is configured to perform a descramble operation on the received data to restore the received data to the data before the scramble operation is performed (also referred to as pre-scrambling data). The checking unit 2140 is configured to verify the received data (e.g., the pre-scrambling data) according to the verification data corresponding to the codeword data (or the raw data expected to be obtained after the decoding procedure) to further determine whether the codeword data is correctly decoded into the raw data. The verification data is, for example, metadata, system data, or other known data.

In the present embodiment, the encoder 2143 and the decoder 2144 use the same algorithm. The algorithm is, for example, a low density parity code (LDPC) algorithm. However, in another embodiment, the algorithm used by the encoder 2143 and the decoder 2144 may also be encoding/decoding algorithms including a BCH code, a convolutional code, a turbo code, bit flipping, etc.

It is noted that the checking unit 2140 may also be integrated into the processor 211. Namely, the processor 211 may have the function of the checking unit 2140 to add the verification data to the raw data and transmit it to the error checking and correcting circuit 214 to perform the encoding operation, or to check whether the obtained raw data is correct based on the system data and the verification data corresponding to the raw data, after receiving the raw data from the error checking and correcting circuit 214. Functions of the components in the error checking and correcting circuit 214 and how they work together will be detailed below with reference to the drawings.

The rewritable non-volatile memory module 220 is coupled to the storage controller 210 (the memory interface control circuit 213) and is configured to store data written by the host system 10. The rewritable non-volatile memory module 220 may be a single level cell (SLC) NAND flash memory module (i.e., a flash memory module capable of storing 1 bit in one memory cell), a multi level cell (MLC) NAND flash memory module (i.e., a flash memory module capable of storing 2 bits in one memory cell), a triple level cell (TLC) NAND flash memory module (i.e., a flash memory module capable of storing 3 bits in one memory cell), a 3D NAND flash memory module, a vertical NAND flash memory module, another flash memory module, or any other memory modules with the same properties. The memory cells in the rewritable non-volatile memory module 220 are disposed in arrays.

In the present embodiment, the memory cells of the rewritable non-volatile memory module 220 constitute a plurality of physical programming units (also referred to as physical sub-units), and the physical programming units constitute a plurality of physical blocks (also referred to as physical erasing units or physical units). Specifically, the memory cells on the same word line (or the same word line layer) constitute one or more of the physical programming units. The processor 211 assigns a plurality of physical addresses respectively to the plurality of physical sub-units.

In the embodiment below, the physical sub-unit is the minimum unit for writing (programming) data. The physical unit is the minimum unit for erasing. Namely, each physical unit contains the least number of memory cells to be erased altogether. Moreover, the physical unit is a physical block, the physical sub-unit is a physical page, and each physical address is configured to reference an address of the corresponding physical page.

It is noted that, in the present embodiment, the system data configured to record information of a physical unit is also referred to as physical unit information, and is recorded by using one or more physical sub-units in the physical unit, or is recorded by using one or more physical sub-units of a specific physical unit configured to record all system data in a system area. In the present embodiment, the physical unit information includes information such as a program/erase cycle (PEC), a timestamp, a read counter value, and a physical unit index of the physical unit. In detail, when the processor 211 performs an erase operation on a physical unit, after completing the erase operation, the processor 211 adds 1 to the current program/erase cycle corresponding to the physical unit (for example, the program/erase cycle accumulates starting from 0 as the erase operation is performed each time). In other words, the program/erase cycle reflects a total count of times that the corresponding physical unit is erased. The timestamp is configured to indicate the time when a first data is stored in the corresponding physical unit. The size of the timestamp (i.e., a difference in numerical value) may serve to indicate a temporal sequence. However, the invention does not intend to limit a detailed format of the timestamp. The read counter value is configured to calculate a total count of times that the corresponding physical unit is read. The physical unit index is configured to represent a unique identification code of the corresponding physical unit, and the processor 211 may identify the corresponding physical unit and relevant data according to the physical unit index.

The storage controller 210 assigns a plurality of logical units to the rewritable non-volatile memory module 220. The host system 10 accesses user data stored in a plurality of physical units through the assigned logical units. Here, each logical unit may be formed of one or more logical addresses. For example, the logical unit may be a logical block, a logical page, or a logical sector. Each logical unit may be mapped to one or more physical units, wherein the physical unit may include one or more physical addresses, one or more physical sectors, one or more physical programming units, or one or more physical erasing units. In the present embodiment, the logical unit is a logical block, and the logical sub-unit is a logical page. Each logical unit includes a plurality of logical sub-units.

Moreover, the storage controller 210 establishes a logical to physical address mapping table and a physical to logical address mapping table to record mapping relations between the logical units (e.g., logical blocks, logical pages, or logical sectors) assigned to the rewritable non-volatile memory module 220 and the physical units (e.g., physical erasing units, physical programming units, or physical sectors). In other words, the storage controller 210 may look up a physical unit mapping a logical unit by referring to the logical to physical address mapping table, and the storage controller 210 may look up a logical unit mapping a physical unit by referring to the physical to logical address mapping table. However, the technical concept of mapping between logical units and physical units is a technical means commonly used by people having ordinary skills in the art, and details in this regard are thus not repeated here.

In an embodiment, the storage controller 210 further includes a buffer memory and a power management circuit. The buffer memory is coupled to the processor 211 and is configured to temporarily store data and commands from the host system 10, data from the rewritable non-volatile memory module 220, or other system data for managing the storage device 20, so that the processor 211 can quickly access the data, the commands, or the system data from the buffer memory. The power management circuit is coupled to the processor 211 and is configured to control the power of the storage device 20.

Figure 3B:
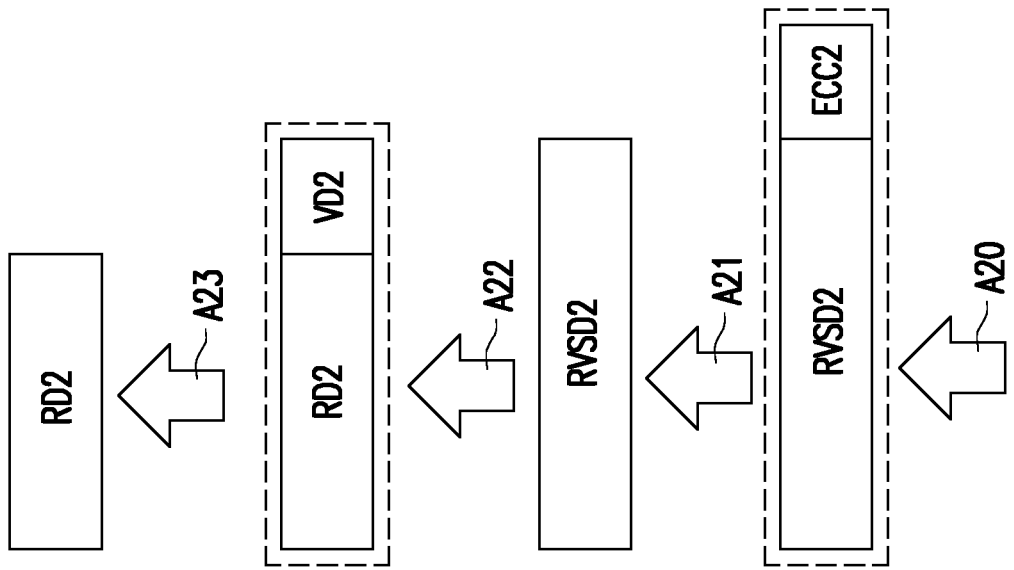
FIG. 3B is a schematic diagram illustrating a codeword data being decoded into a raw data according to an embodiment of the invention.
Figure 3A:
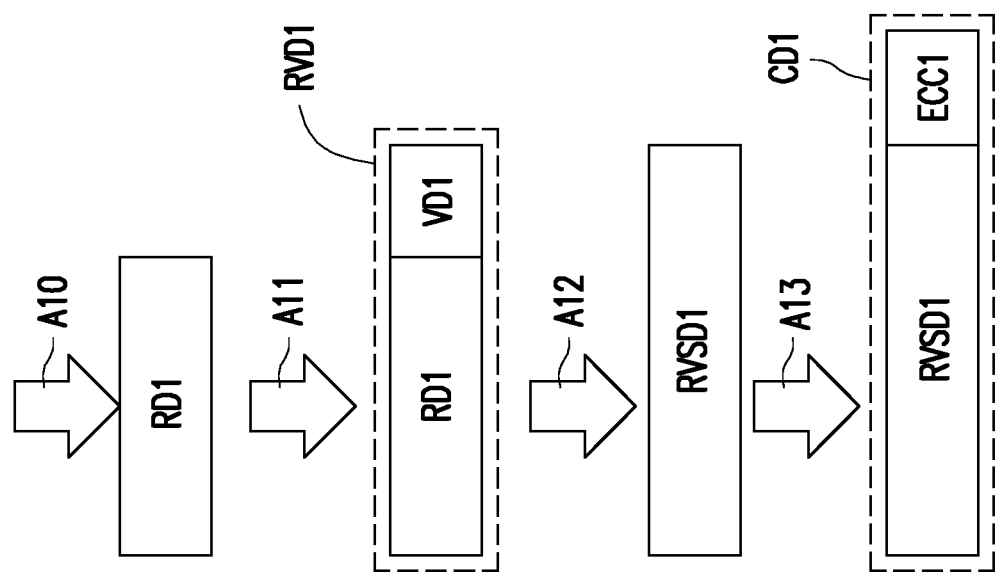
FIG. 3A is a schematic diagram illustrating a raw data being encoded into a codeword data according to an embodiment of the invention.
Figure 4A:
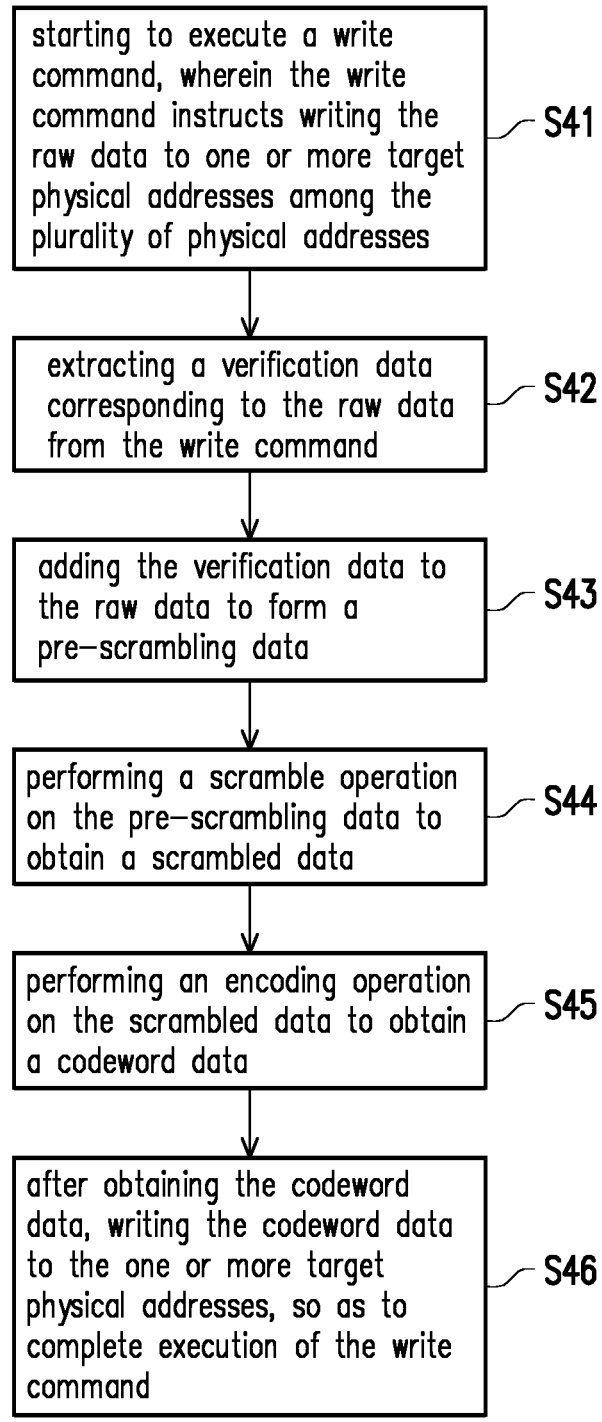
FIG. 4A is a flowchart illustrating a data encoding method according to an embodiment of the invention.

FIG. 3A is a schematic diagram illustrating a raw data being encoded into a codeword data according to an embodiment of the invention. FIG. 4A is a flowchart illustrating a data encoding method according to an embodiment of the invention. Referring to FIG. 2, FIG. 3A, and FIG. 4A at the same time, in step S41, the processor 211 starts to execute a write command, wherein the write command instructs writing the raw data to one or more target physical addresses among the plurality of physical addresses.

For example, in the present embodiment, it is assumed that the host system 10 sends a write command and a raw data RD1 to the processor 211, and the write command instructs storing the raw data RD1 to one or more logical addresses (also referred to as target logical addresses). According to the write command, the processor 211 selects one or more physical addresses (also referred to as target physical addresses) among all available physical addresses in the rewritable non-volatile memory module 220 to store the raw data RD1. The processor 211 transmits the raw data RD1 to the error checking and correcting circuit 214 to start to perform an encoding procedure on the raw data RD1 (as indicated by an arrow A10 illustrated in FIG. 2).

Then, after receiving the raw data RD1, in step S42, the checking unit 2140 extracts a verification data VD1 corresponding to the raw data from the write command. In other words, the checking unit 2140 may directly read the verification data VD1 corresponding to the raw data from the write command. The verification data VD1 may be one or more target logical addresses configured to store the raw data RD1. Details of step S42 and the verification data VD1 will be described below with reference to FIG. 4B.

Figure 4B:
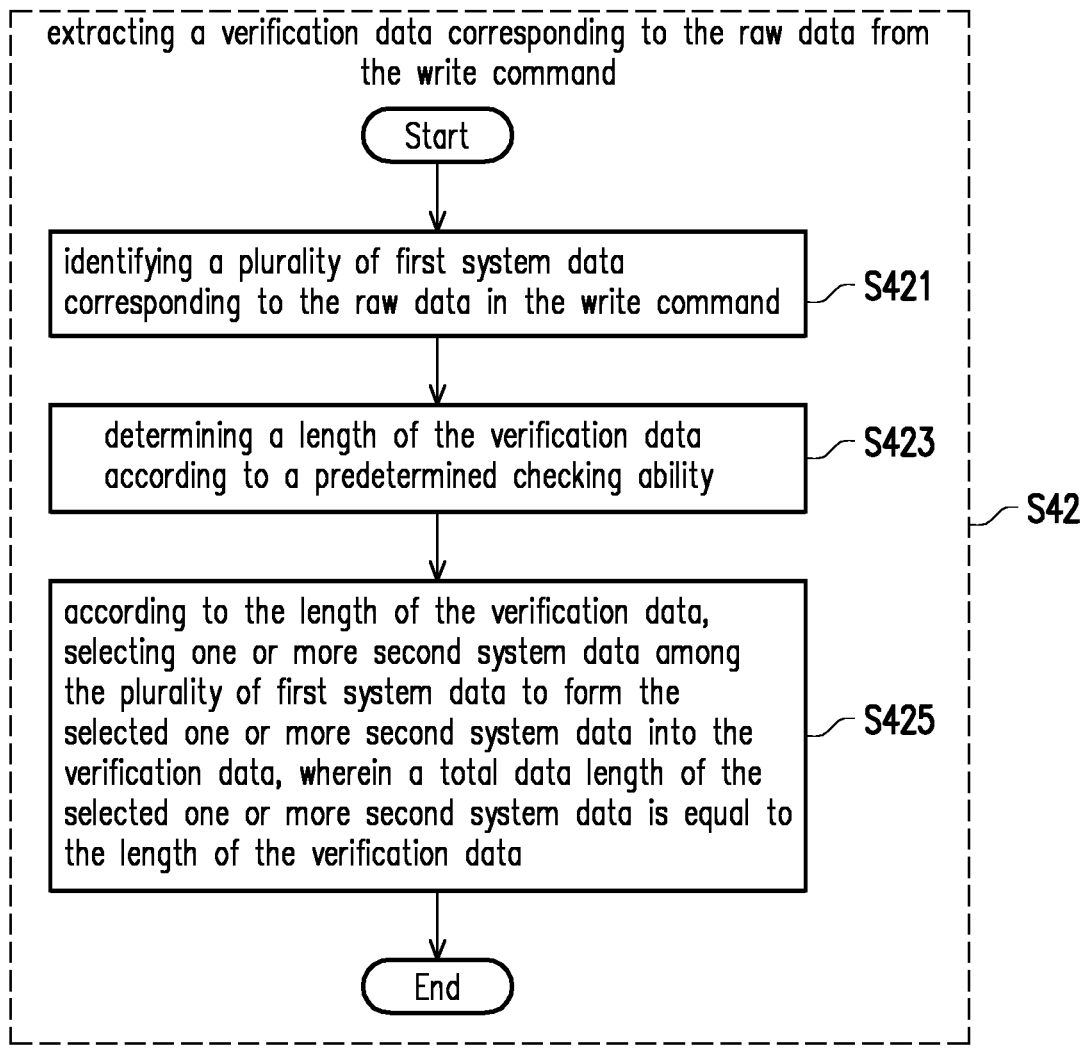
FIG. 4B is a flowchart illustrating step S42 in FIG. 4A according to an embodiment of the invention.

FIG. 4B is a flowchart illustrating step S42 in FIG. 4A according to an embodiment of the invention. Referring to FIG. 4B, in the present embodiment, in step S421, the checking unit 2140 identifies a plurality of first system data corresponding to the raw data in the write command. In the present embodiment, the write command includes a plurality of first system data and a command description. The first system data include one or combination of the following information: one or more target logical addresses configured to store the raw data RD1; one or more target physical addresses configured to store the raw data RD1; and physical unit information of the target physical unit configured to store the raw data RD1. Examples of the "physical unit information" have been mentioned above and are thus not repeatedly described here. The first system data respectively have their own data lengths. Moreover, according to information of the command description of the write command, the processor 211 is aware that the write command is instructing that to write the raw data to the one or more target logical addresses.

Next, in step S423, the checking unit 2140 determines a length of the verification data according to a predetermined checking ability. Specifically, a manufacturer may set the checking ability of the checking unit 2140 according to its needs. As the checking ability varies, a range of the length of the verification data also varies. For example, the range of the length of the verification data may be 1 to 16 bytes. In other words, the length of the verification data may be set in advance.

Then, in step S425, according to the length of the verification data, the checking unit 2140 selects one or more second system data among the plurality of first system data to form the selected one or more second system data into the verification data, wherein a total data length of the selected one or more second system data is equal to the length of the verification data. Specifically, since the length of the verification data is determined, the checking unit 2140 may select one or more first system data among the plurality of first system data accordingly, such that a total of the data lengths (also referred to as the total data length) of the selected first system data (also referred to as the one or more second system data) is equal to the predetermined length of the verification data. Next, after the one or more second system data are determined, the checking unit 2140 reads the one or more second system data from the write command to form the one or more second system data into a verification data (namely, the checking unit 2140 obtains the verification data). In other words, when the length of the verification data is changed, the checking unit 2140 may correspondingly change a type of the second system data to form a different verification data. Moreover, in an embodiment, the checking unit 2140 may also divide one or more specific first system data to form the second system data, so that the length of the verification data formed by merging the one or more second system data is in line with the predetermined value.

It is noted that an arrangement sequence of the plurality of second system data forming the verification data may be changed according to the needs or the setting. Moreover, based on the description of FIG. 4B, it is known that the verification data may be directly read from the write command corresponding to the raw data, and it is not necessary to take additional resources to calculate or encode the verification data.

Referring back to FIG. 4A, after the verification data is obtained, in step S43, as indicated by an arrow A11 in FIG. 2 and FIG. 3A, the checking unit 2140 adds the verification data VD1 to the raw data RD1 to form a pre-scrambling data RVD1. Moreover, the pre-scrambling data RVD1 is transmitted to the scrambler 2141 to perform a scramble operation.

After obtaining the pre-scrambling data RVD1, in step S44, as indicated by an arrow A12 in FIG. 2 and FIG. 3A, the scrambler 2141 performs a scramble operation on the pre-scrambling data RVD1 to obtain a scrambled data RVSD1. Moreover, the scrambled data RVSD1 is transmitted to the encoder 2143 to perform an encoding operation.

After obtaining the scrambled data RVSD1, in step S45, as indicated by an arrow A13 in FIG. 2 and FIG. 3A, the encoder 2143 performs an encoding operation on the scrambled data RVSD1 to obtain a codeword data CD1. Specifically, after performing the encoding operation on the scrambled data RVSD1, the encoder 2143 generates an error checking and correcting code ECC1, and the encoder 2143 adds the error checking and correcting code ECC1 to the scrambled data RVSD1 to form the codeword data CD1 (as shown in FIG. 3A).

Lastly, in step S46, after the codeword data is obtained, the codeword data is written to the one or more target physical addresses, so as to complete execution of the write command. Specifically, after obtaining the codeword data CD1, the error checking and correcting circuit 214 responds to the processor 211 that encoding of the codeword data corresponding to the raw data RD1 is completed. The processor 211 may write the encoded codeword data CD1 to the one or more target physical addresses, so as to complete execution of the write command. Moreover, the processor 211 may also map the one or more target logical addresses to the one or more target physical addresses and respond to the host system 10 that the raw data RD1 is written to the rewritable non-volatile memory module 220 (namely, the write command is completed).

It is noted that, in the foregoing embodiment, the write command is sent by the host system to write the raw data, which is user data. However, in another embodiment, the write command may also be configured to perform a data write operation executed by the processor 211 corresponding to a management operation (e.g., a data merge operation, a garbage collection operation, etc.) for managing the stored data.

Figure 5A:
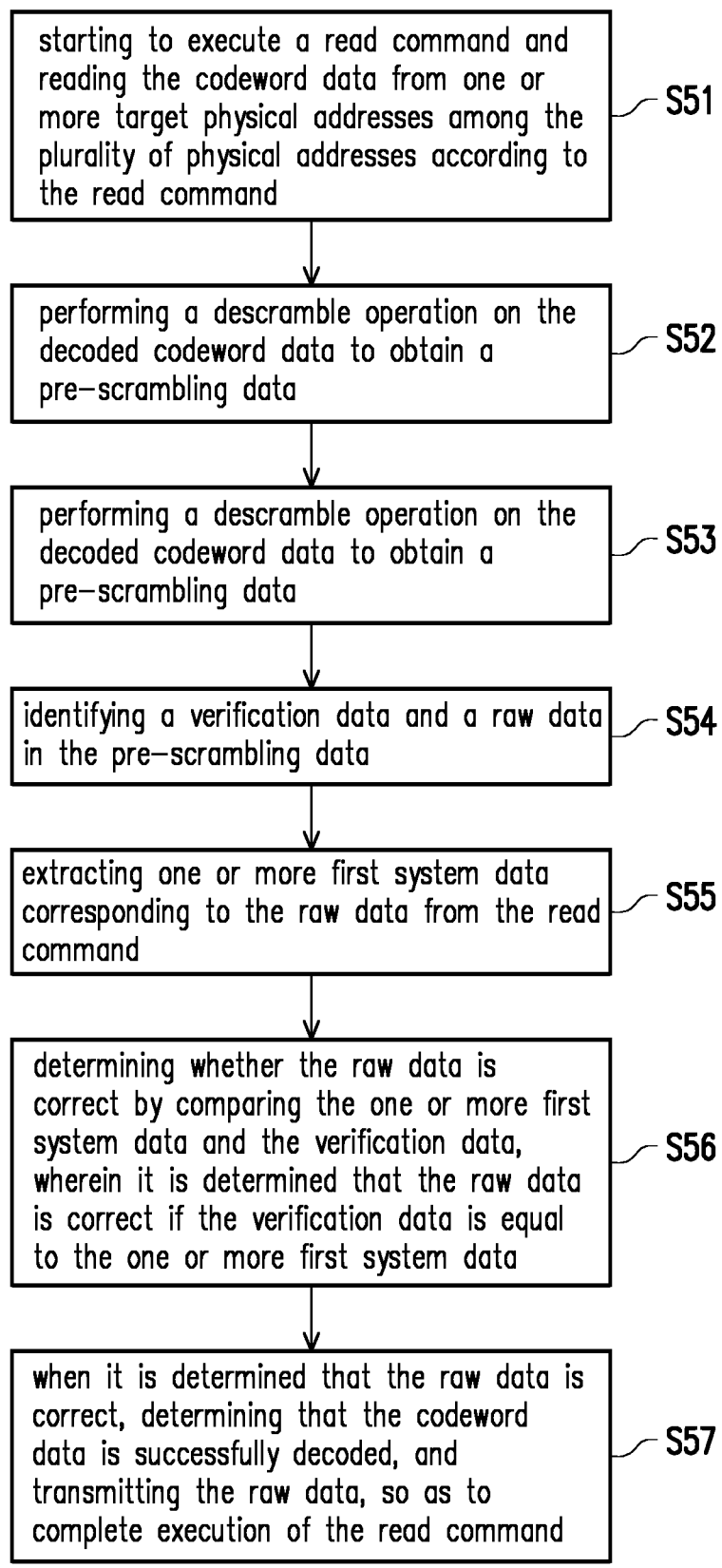
FIG. 5A is a flowchart illustrating a data decoding method according to an embodiment of the invention.

FIG. 3B is a schematic diagram illustrating a codeword data being decoded into a raw data according to an embodiment of the invention. FIG. 5A is a flowchart illustrating a data decoding method according to an embodiment of the invention. Referring to FIG. 2, FIG. 3B, and FIG. 5A at the same time, in step S51, the processor 211 starts to execute a read command and reads the codeword data from one or more target physical addresses among the plurality of physical addresses according to the read command.

For example, in the present embodiment, it is assumed that the host system 10 sends a read command to the processor 211, and the read command instructs reading a raw data from one or more logical addresses (also referred to as target logical addresses). According to the read command, the processor 211 reads a codeword data CD2 (the codeword data CD2 is data of the raw data that is to be read by the host system 10 and is encoded and written to the target physical address) from one or more physical addresses (also referred to as target physical addresses) mapping to the one or more target logical addresses among all available physical addresses in the rewritable non-volatile memory module 220. The processor 211 transmits the codeword data CD2 to the error checking and correcting circuit 214 to start to perform a decoding procedure on the codeword data CD2 (as indicated by an arrow A20 illustrated in FIG. 2).

Then, after receiving the codeword data CD2, in step S52, as indicated by an arrow A21 in FIG. 2 and FIG. 3B, the decoder 2144 performs the decoding operation on the codeword data CD2 to obtain a decoded codeword data RVSD2 (also referred to as a scrambled data RVSD2). Specifically, referring to FIG. 3B, the decoder 2144 identifies an error checking and correcting code ECC2 and the scrambled data RVSD2 in the codeword data CD2, and the decoder 2144 checks and corrects the scrambled data RVSD2 according to the error checking and correcting code ECC2 and finally outputs the decoded codeword data RVSD2 after decoding. The decoded codeword data RVSD2 is transmitted to the descrambler 2142 to perform a descramble operation.

Referring back to FIG. 5A, after obtaining the decoded codeword data RVSD2, in step S53, as indicated by an arrow A22 in FIG. 2 and FIG. 3B, the descrambler 2142 performs a descramble operation on the decoded codeword data RVSD2 to obtain a pre-scrambling data RVD2. Moreover, the pre-scrambling data RVD2 is transmitted to the checking unit 2140 to perform a checking operation.

After obtaining the pre-scrambling data RVD2, in step S54, the checking unit 2140 identifies a verification data VD2 and a raw data RD2 in the pre-scrambling data RVD2 (as shown in FIG. 3B).

Then, in step S55, the checking unit 2140 extracts one or more first system data corresponding to the raw data RD2 from the read command. In other words, the checking unit 2140 may directly read system data configured to check whether the verification data VD2 is correct from the read command. The system data may be one or more target logical addresses storing the raw data RD2. Details of step S55 and the system data will be described below with reference to FIG. 5B.

Figure 5B:
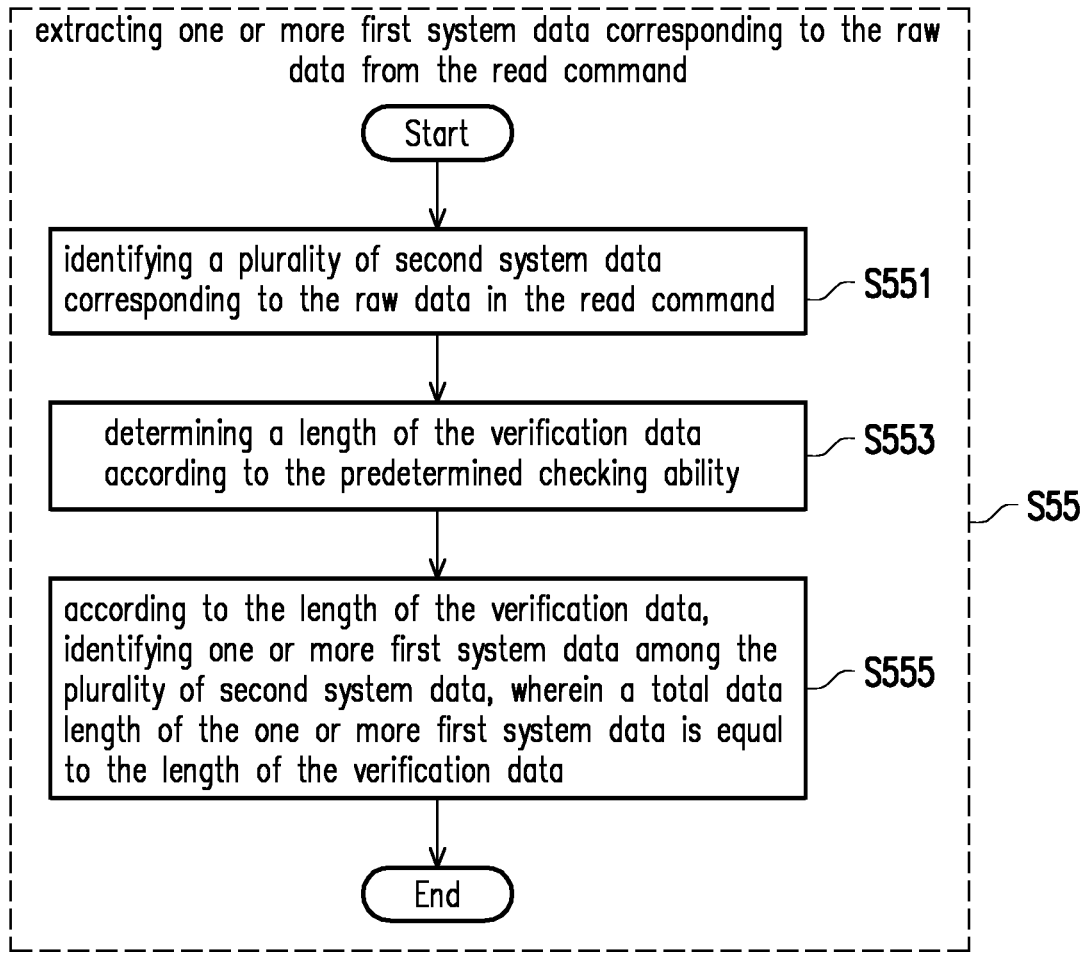
FIG. 5B is a flowchart illustrating step S55 in FIG. 5A according to an embodiment of the invention.

FIG. 5B is a flowchart illustrating step S55 in FIG. 5A according to an embodiment of the invention. Referring to FIG. 5B, in the present embodiment, in step S551, the checking unit 2140 identifies a plurality of second system data corresponding to the raw data in the read command. In the present embodiment, the plurality of second system data are the plurality of first system data in the foregoing encoding operation and generally refer to various system data corresponding to the raw data, and the read command includes a command description and the plurality of second system data. Specifically, the command description of the read command is configured to instruct the processor 211 to read the raw data RD2 from one or more target logical addresses. Then, according to the logical to physical address mapping table, the processor 211 finds one or more target physical addresses configured to store the codeword data obtained after encoding the raw data. The second system data are configured to check whether the raw data RD2 obtained after performing the decoding procedure on the codeword data comes from the target logical address to be read by the read command.

Next, in step S553, the checking unit 2140 determines a length of the verification data VD2 according to the predetermined checking ability. This step is identical to step S423.

Then, in step S555, according to the length of the verification data, the checking unit 2140 selects one or more first system data among the plurality of second system data to form the selected one or more first system data into the verification data, wherein a total data length of the selected one or more first system data is equal to the length of the verification data. Specifically, similar to the description of step S425 above, in the decoding procedure described in the present embodiment, the selected one or more first system data are the selected one or more second system data in the encoding procedure and are selected and read according to the predetermined length of the verification data to be formed into the verification data. In other words, in step S555, according to the length of the verification data VD2, the checking unit 2140 identifies which system data (referred to as the first system data in the present embodiment) among the plurality of second system data in the read command are to form the verification data. Accordingly, based on the description of FIG. 4B, it is known that the processor 211 may directly read the system data from the read command corresponding to the raw data to check whether the raw data RD2 obtained from the codeword data CD2 is correct by comparing with the verification data VD2. Obtaining the system data used to compare with the verification data VD2 does not require calculation or encoding which takes additional resources.

Referring back to FIG. 5A, next, in step S56, the checking unit 2140 determines whether the raw data RD2 is correct by comparing the one or more first system data and the verification data VD2, wherein it is determined that the raw data RD2 is correct if the verification data is equal to the one or more first system data. Specifically, after identifying the one or more first system data, the checking unit 2140 compares whether the verification data VD2 is equal to the identified one or more first system data (i.e., whether all data bits of the checking unit 2140 are equal to a plurality of data bits formed by sorting the one or more first system data). If they are equal, the checking unit 2140 determines that the raw data RD2 is correct.

Then, in step S57, when it is determined that the raw data RD2 is correct, it is determined that the codeword data is successfully decoded, and the error checking and correcting circuit 214 transmits the raw data RD2, so as to complete execution of the read command.

Specifically, after it is determined that the raw data RD2 is correct, the error checking and correcting circuit 214 responds to the processor 211 that the decoding procedure corresponding to the codeword data CD2 is completed, and the corresponding raw data RD2 is obtained. The raw data RD2 is the raw data corresponding to the read command. Moreover, the processor 211 may respond to the host system 10 that reading of the raw data RD2 stored in the one or more logical addresses is completed, and transmit the raw data RD2 back to the host system 10, so as to complete execution of the read command.

It is noted that, in the foregoing embodiment, the read command is sent by the host system to read the raw data, which is user data. However, in another embodiment, the read command may also be configured to perform a data read operation executed by the processor 211 corresponding to a management operation (e.g., a data merge operation, a garbage collection operation, etc.) for managing the stored data.

It is noted that operations of the components of the error checking and correcting circuit 214 are also regarded as operations executed by the error checking and correcting circuit 214.

According to the data encoding method, the data decoding method, and the storage controller implementing the methods described in the foregoing embodiments, it is possible to check whether the decoded data is correct without disposing a cyclic redundancy checker (CRC).

However, another embodiment combining the current CRC technical means with the data encoding method and the data decoding method above is provided, and the differences from the foregoing embodiments will be described below.

Specifically, in the encoding procedure, after the verification data corresponding to the raw data is obtained, the checking unit 2140 performs a cyclic redundancy check operation on the verification data and the raw data to obtain a cyclic redundancy check code. Then, the checking unit 2140 performs a XOR operation according to the cyclic redundancy check code and the verification data to obtain an adjusted verification data. Next, in the operation where the checking unit 2140 adds the verification data to the raw data to form the pre-scrambling data (as indicated by the arrow A11), the checking unit 2140 adds the adjusted verification data instead of the verification data to the raw data to form the pre-scrambling data.

On the other hand, in the decoding procedure, after the one or more first system data are identified, the checking unit 2140 performs a cyclic redundancy check operation on the one or more first system data and the raw data to obtain a cyclic redundancy check code. Then, the checking unit 2140 performs a XOR operation according to the cyclic redundancy check code and the verification data to obtain an adjusted verification data. Next, in the operation of determining whether the raw data is correct by comparing the one or more first system data and the verification data, the checking unit 2140 compares the adjusted verification data, instead of the verification data, and the one or more first system data. If the adjusted verification data is equal to the one or more first system data, the checking unit 2140 determines that the raw data RD2 is correct. Accordingly, the adjusted verification data obtained through the cyclic redundancy check operation is used to replace the verification data to enhance reliability of the encoding procedure and the decoding procedure.

In summary of the above, in the data encoding method, the data decoding method, and the storage controller provided in the embodiments of the invention, in the encoding operation, the verification data is obtained according to the write command corresponding to the raw data to add the verification data to the raw data and then perform the encoding operation, and it is not necessary to add the cyclic redundancy check code to the raw data, which reduces the space consumed by the overall codeword data. Moreover, in the decoding operation, the one or more first system data are identified according to the read command corresponding to the codeword data, and it is determined whether the raw data obtained after decoding is correct according to the one or more first system data and the verification data. In particular, the encoding/decoding operations save the resources/capacity consumed by the cyclic redundancy check operation. Accordingly, it is still possible to check whether the decoded data is correct without the cyclic redundancy check code, which further solves the issue of near codewords and enhances overall efficiency in encoding/decoding data by the storage device while saving resources.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A data encoding method for encoding a raw data to be stored to a rewritable non-volatile memory module, wherein the rewritable non-volatile memory module has a plurality of physical units, and each of the physical units comprises a plurality of physical sub-units, wherein a plurality of physical addresses are assigned to the physical sub-units, the method comprising:

executing a write command, wherein the write command instructs writing the raw data to one or more target physical addresses among the physical addresses;

obtaining a verification data corresponding to the raw data from the write command, wherein the verification data is directly read from data of the write command, and the verification data is a part of the data of the write command, wherein obtaining the verification data corresponding to the raw data from the write command comprises:

identifying a plurality of first system data corresponding to the raw data in the write command;

determining a length of the verification data according to a predetermined checking ability; and selecting one or more second system data among the first system data according to the length of the verification data to form the selected one or more second system data as the verification data, wherein a total data length of the selected one or more second system data is equal to the length of the verification data, wherein the first system data comprise one or more target logical addresses configured to store the raw data, one or more target physical addresses configured to store the raw data, and physical unit information of a target physical unit configured to store the raw data;

adding the verification data to the raw data to form a pre-scrambling data;

performing a scramble operation on the pre-scrambling data to obtain a scrambled data;

performing an encoding operation on the scrambled data to obtain a codeword data; and writing the codeword data to the one or more target physical addresses after obtaining the codeword data, so as to complete execution of the write command.

2. The data encoding method according to claim 1, further comprising:

after obtaining the verification data corresponding to the raw data, performing a cyclic redundancy check operation on the verification data and the raw data to obtain a cyclic redundancy check code;

according to the cyclic redundancy check code and the verification data, performing a XOR operation to obtain an adjusted verification data; and in the step of adding the verification data to the raw data to form the pre-scrambling data, adding the adjusted verification data instead of the verification data to the raw data to form the pre-scrambling data.

3. A data decoding method for decoding a codeword data stored in a rewritable non-volatile memory module, wherein the rewritable non-volatile memory module has a plurality of physical units, and each of the physical units comprises a plurality of physical sub-units, wherein a plurality of physical addresses are assigned to the physical sub-units, the method comprising:

executing a read command, and reading the codeword data from one or more target physical addresses among the physical addresses according to the read command;

performing a decoding operation on the codeword data to obtain a decoded codeword data;

performing a descramble operation on the decoded codeword data to obtain a pre-scrambling data;

identifying a verification data and a raw data in the pre-scrambling data;

obtaining one or more first system data corresponding to the raw data in the read command, wherein the one or more first system data are directly read from data of the read command, and the one or more first system data is a part of the data of the read command, wherein obtaining the one or more first system data corresponding to the raw data in the read command comprises:
identifying a plurality of second system data corresponding to the raw data in the read command;
determining a length of the verification data according to a predetermined checking ability; and
identifying the one or more first system data among the second system data according to the length of the verification data, wherein a total data length of the one or more first system data is equal to the length of the verification data,
wherein the second system data comprise one or more target logical addresses configured to store the raw data, one or more target physical addresses configured to store the raw data, and physical unit information of a target physical unit configured to store the raw data;
determining whether the raw data is correct by comparing the one or more first system data and the verification data, wherein it is determined that the raw data is correct if the verification data is equal to the one or more first system data; and
determining that the codeword data is successfully decoded when it is determined that the raw data is correct, and transmitting the raw data, so as to complete execution of the read command.

4. The data decoding method according to claim 3, further comprising:
after identifying the one or more first system data, performing a cyclic redundancy check operation on the one or more first system data and the raw data to obtain a cyclic redundancy check code;
performing an XOR operation according to the cyclic redundancy check code and the verification data to obtain an adjusted verification data; and
in the step of determining whether the raw data is correct by comparing the one or more first system data and the verification data, comparing the adjusted verification data, instead of the verification data, and the one or more first system data.

5. A storage controller configured to control a storage device provided with a rewritable non-volatile memory module, wherein the rewritable non-volatile memory module comprises a plurality of physical units, and each of the physical units comprises a plurality of physical sub-units, wherein a plurality of physical addresses are assigned to the physical sub-units, the storage controller comprising:
a memory interface control circuit configured to couple to the rewritable non-volatile memory module;
an error checking and correcting circuit configured to encode a raw data to be stored to the rewritable non-volatile memory module; and
a processor coupled to the memory interface control circuit and the error checking and correcting circuit,
wherein the processor is configured to execute a write command to transmit the raw data to the error checking and correcting circuit, wherein the write command instructs writing the raw data to one or more target physical addresses among the physical addresses,
wherein the error checking and correcting circuit is configured to obtain a verification data corresponding to the raw data according to the write command, wherein the verification data is directly read from data of the write command, and the verification data is a part of the data of the write command,
wherein the error checking and correcting circuit is further configured to add the verification data to the raw data to form a pre-scrambling data,
wherein the error checking and correcting circuit is further configured to perform a scramble operation on the pre-scrambling data to obtain a scrambled data,
wherein the error checking and correcting circuit is further configured to perform an encoding operation on the scrambled data to obtain a codeword data and respond to the processor that encoding of the codeword data corresponding to the raw data is completed,
wherein the processor is further configured to write the codeword data to the one or more target physical addresses, so as to complete execution of the write command,
wherein in the operation where the error checking and correcting circuit is further configured to obtain the verification data corresponding to the raw data according to the write command,
the error checking and correcting circuit identifies a plurality of first system data corresponding to the raw data according to the write command,
wherein the error checking and correcting circuit determines a length of the verification data according to a predetermined checking ability,
wherein the error checking and correcting circuit selects one or more second system data among the first system data according to the length of the verification data to form the selected one or more second system data as the verification data, wherein a total data length of the selected one or more second system data is equal to the length of the verification data,
wherein the first system data comprise one or more target logical addresses configured to store the raw data, one or more target physical addresses configured to store the raw data, and physical unit information of a target physical unit configured to store the raw data.

6. The storage controller according to claim 5,
wherein, after obtaining the verification data corresponding to the raw data, the error checking and correcting circuit performs a cyclic redundancy check operation on the verification data and the raw data to obtain a cyclic redundancy check code, wherein the error checking and correcting circuit performs a XOR operation according to the cyclic redundancy check code and the verification data to obtain an adjusted verification data,
wherein in the operation where the error checking and correcting circuit is further configured to add the verification data to the raw data to form the pre-scrambling data, the error checking and correcting circuit adds the adjusted verification data instead of the verification data to the raw data to form the pre-scrambling data.

7. A storage controller configured to control a storage device provided with a rewritable non-volatile memory module, wherein the rewritable non-volatile memory module comprises a plurality of physical units, and each of the physical units comprises a plurality of physical sub-units, wherein a plurality of physical addresses are assigned to the physical sub-units, the storage controller comprising:
a memory interface control circuit configured to couple to the rewritable non-volatile memory module;
an error checking and correcting circuit configured to decode a codeword data stored in the rewritable non-volatile memory module; and a processor coupled to the memory interface control circuit and the error checking and correcting circuit, wherein the processor is configured to execute a read command, read the codeword data from one or more target physical addresses among the physical addresses according to the read command, and transmit the codeword data to the error checking and correcting circuit, wherein the error checking and correcting circuit is configured to perform a decoding operation on the codeword data to obtain a decoded codeword data, wherein the error checking and correcting circuit is further configured to perform a descramble operation on the decoded codeword data to obtain a pre-scrambling data, wherein the error checking and correcting circuit is further configured to identify a verification data and a raw data in the pre-scrambling data, wherein the error checking and correcting circuit is further configured to identify one or more first system data corresponding to the raw data according to the read command, wherein the one or more first system data are directly read from data of the read command, and the one or more first system data is a part of the data of the read command, wherein the error checking and correcting circuit is further configured to determine whether the raw data is correct by comparing the one or more first system data and the verification data, wherein the error checking and connecting circuit determines that the raw data is correct if the verification data is equal to the one or more first system data, wherein when it is determined that the raw data is correct, the error checking and correcting circuit determines that the codeword data is successfully decoded, transmits the raw data, and responds to the processor that the raw data corresponding to the codeword data is successfully decoded, so as to complete execution of the read command, wherein in the operation where the error checking and correcting circuit is further configured to identify the one or more first system data corresponding to the raw data according to the read command, the error checking and correcting circuit identifies a plurality of second system data corresponding to the raw data according to the read command, wherein the error checking and correcting circuit determines a length of the verification data according to a predetermined checking ability, wherein the error checking and correcting circuit identifies the one or more first system data among the second system data according to the length of the verification data, wherein a total data length of the one or more first system data is equal to the length of the verification data, wherein the second system data comprise one or more target logical addresses configured to store the raw data, one or more target physical addresses configured to store the raw data, and physical unit information of a target physical unit configured to store the raw data.

8. The storage controller according to claim 7, wherein the error checking and correcting circuit performs a cyclic redundancy check operation on the one or more first system data and the raw data after the one or more first system data are identified to obtain a cyclic redundancy check code, wherein the error checking and correcting circuit performs a XOR operation according to the cyclic redundancy check code and the verification data to obtain an adjusted verification data, wherein in the operation of determining whether the raw data is correct by comparing the one or more first system data and the verification data, the error checking and correcting circuit compares the adjusted verification data, instead of the verification data, and the one or more first system data.

* * * * *